US009340736B2

(12) United States Patent
Furumura et al.

(10) Patent No.: US 9,340,736 B2
(45) Date of Patent: May 17, 2016

(54) SOLID GASIFICATION APPARATUS

(71) Applicant: PHILTECH Inc., Tokyo (JP)

(72) Inventors: Yuji Furumura, Kanagawa (JP); Naomi Mura, Tokyo (JP); Shinji Nishihara, Tokyo (JP); Noriyoshi Shimizu, Tokyo (JP)

(73) Assignee: PHIL TECH Inc., Tokyo (JP)

( * ) Notice: Subject to any disclaimer, the term of this patent is extended or adjusted under 35 U.S.C. 154(b) by 0 days.

(21) Appl. No.: 14/679,952

(22) Filed: Apr. 6, 2015

(65) Prior Publication Data

US 2015/0315501 A1    Nov. 5, 2015

(30) Foreign Application Priority Data

May 1, 2014   (JP) ................. 2014-094788
Jan. 6, 2015   (JP) ................. 2015-000671

(51) Int. Cl.
| | |
|---|---|
| *C10J 3/00* | (2006.01) |
| *C10J 3/02* | (2006.01) |
| *C10J 3/20* | (2006.01) |
| *C10J 3/22* | (2006.01) |
| *C23C 16/448* | (2006.01) |
| *C10J 3/80* | (2006.01) |
| C23C 16/44 | (2006.01) |
| B01J 19/00 | (2006.01) |
| B01J 19/02 | (2006.01) |
| B01J 19/24 | (2006.01) |

(52) U.S. Cl.
CPC .... *C10J 3/80* (2013.01); *C10J 3/20* (2013.01); *C23C 16/4488* (2013.01); *C10J 2200/15* (2013.01)

(58) Field of Classification Search
CPC ........ B01J 19/00; B01J 19/0053; B01J 19/02; B01J 19/24; C10J 3/00; C10J 3/02; C10J 3/20; C10J 3/72; C10J 3/80; C10J 2200/15; C10J 2200/152; C23C 16/44; C23C 16/448; C23C 16/4488
See application file for complete search history.

(56) References Cited

U.S. PATENT DOCUMENTS

| | | | |
|---|---|---|---|
| 8,206,471 B1 * | 6/2012 | Tharpe, Jr. .............. | C10B 49/08 423/644 |
| 2002/0136671 A1 * | 9/2002 | Otsuka ................... | B01D 53/58 422/168 |
| 2008/0018004 A1 | 1/2008 | Steidl et al. | |

(Continued)

FOREIGN PATENT DOCUMENTS

| | | |
|---|---|---|
| JP | 2008-60536 A | 3/2008 |
| JP | 2009-173463 A | 8/2009 |

(Continued)

OTHER PUBLICATIONS

Heat Beam: HB, Philtech, Jul. 23, 2009.*

(Continued)

*Primary Examiner* — Natasha Young
(74) *Attorney, Agent, or Firm* — Nakanishi IP Associates, LLC

(57) ABSTRACT

A solid gasification apparatus includes a reaction chamber thermally insulated by a heat insulating material, a heat beam fluid heat exchange apparatus that produces a first heated gas and a second heated gas, and a unit that includes a gas flow path. The unit sprays the first heated gas against a material solid in a reaction chamber to heat the material solid, and, simultaneously, makes the material solid react with the first heated gas to produce a produced gas containing the element of the material solid. The unit makes a second heated gas contact and react with the produced gas.

5 Claims, 4 Drawing Sheets

(56) References Cited

U.S. PATENT DOCUMENTS

2013/0098455 A1* 4/2013 Ng .................. C23C 16/303 137/1
2013/0302021 A1 11/2013 Furumura et al.

FOREIGN PATENT DOCUMENTS

| JP | 2013-060340 A | 4/2013 |
| JP | 2013-235945 A | 11/2013 |
| JP | 2014-053477 A | 3/2014 |
| JP | 2014-059080 A | 4/2014 |

OTHER PUBLICATIONS

"Free standing GaN wafers produced by void-assisted separation", Hitachi Densen, No. 26 (Jan. 2007), pp. 31-36 (with a page indicating publication date), published in Japan on Jan. 1, 2007 (7 pages).

* cited by examiner

SOLID GASIFICATION APPARATUS

CROSS REFERENCE TO RELATED APPLICATIONS

This application is based on and claims the benefit of priority to Japanese Patent Applications No. 2014-094788 filed on May 1, 2014 and No. 2015-000671 filed on Jan. 6, 2015, the contents of which are hereby incorporated by reference in their entirety.

TECHNICAL FIELD

The present invention relates to a solid gasification apparatus which produces a gas containing the element of a solid by spraying a heated gas on the solid so as to make the gas contact the solid.

BACKGROUND ART

When growing a film containing a metal element on a substrate, there is available an MOCVD (Metallo Organic Chemical Vapor Deposition) method using an organic metal gas. According to this method, when an organic metal to be used is a liquid, the organic metal formed into mist by a bubbling method is transported by a carrier gas to a reaction chamber. HVPE (Hydride Vapor Phase Epitaxy) is a method compared with MOCVD. According to this method, a metal is reacted with, for example, hydrogen chloride at a high temperature and is transported as a metallic chloride remaining at a high temperature to a substrate, thereby making the metallic chloride react with another gas on the heated substrate and growing a thin film of the compound. That is, HVPE allows a large amount of raw metal to be transported to a film growth reaction apparatus at a high speed, and hence can implement high-speed film growth.

The above method will be described by taking an example. A plate with Ga metal is placed in a heated quartz tube, and hydrogen chloride is let into the tube to produce Ga chloride ($GaCl_3$). This Ga chloride is then transported to a downstream high-temperature portion while being kept at a high temperature (this transportation will be referred to as high-temperature transportation in this case). At the same time, when ammonia ($NH_3$) is let into the same quartz tube, a GaN crystal grows on a substrate placed at the downstream high-temperature portion (see, for example, non-patent literature 1 and patent literature 1).

There is also available a method of melting a synthesized Ga chloride ($GaCl_3$) at a temperature equal to or more than 78° C., bubbling it, and performing high-temperature transportation while keeping it at a temperature of about 130° C. (see, for example, patent literature 2). This HVPE reaction system has no organic material contained in a reaction gas, and hence can perform high-purity film deposition under wide temperature conditions. In addition, this method does not use a large amount of carrier gas, it is possible to achieve film growth at a speed 10 or more times higher than MOCVD using an organic metal as a raw material.

As a commercial-scale GaN crystal growth technique, MOCVD (Metallo Organic Chemical Vapor Deposition), which can transport a gas in a room-temperature region, is actually dominating the market as compared with HVPE. Assume that there are an apparatus or component (to be referred to as a solid gasification apparatus hereinafter) which produces a gas containing a material solid component by efficiently making a high-temperature gas contact a material solid, and an inexpensive, compact apparatus or component (to be referred to as a heated gas contacting apparatus hereinafter) which transports a produced gas while keeping it at a high temperature, and mixes the gas with another gas heated to a high temperature in another place so as to make them contact each other. In this case, the structure of the HVPE apparatus can be simplified.

Patent literature 3 discloses an invention relating to a solid gasification apparatus. The technique disclosed in patent literature 3 is an apparatus which produces a gas containing the element component of a solid by heating the solid and supplying a gas to it. This apparatus is configured to heat the solid itself by using a lamp, and has a large, complicated structure. In addition, the apparatus includes a mechanism which mechanically moves to open and close for the supply of a produced gas. This further complicates the structure. In practice, however, the structure is preferably reduced in size and simplified.

As described above, to simplify the structure of the solid gasification apparatus is a starting point of the present invention.

In this case, a compact, inexpensive solid gasification apparatus having a simplified structure can be applied to another industry, and hence is industrially important. If a solid is an organic material and a highly heated gas is superheated steam, the solid gasification apparatus produces methane gas ($CH_4$) and hydrogen ($H_2$). When a heated gas contacting apparatus makes 1,000° C. methane gas ($CH_4$) contact 1,000° C. superheated steam, they react with each other to produce hydrogen and carbon dioxide gas. That is, the solid gasification apparatus is an apparatus for producing hydrogen and methane by decomposing an organic material, and hence can be used as a component of an apparatus or system designed to extract renewable energy from an organic material. That is, an apparatus designed to produce a gas by making a gas heated to a high temperature contact a solid is effective not only in the industrial field of HVPE but also in the industry of extracting renewable energy providing a huge market.

However, it is not easy to instantly heat a gas to a high temperature, and hence the conventional apparatus inevitably increases in size. More specifically, a conventional method in practical use is a method of producing a gas by inserting a material, which is to be heated to a high temperature, into a bundle of thin metal pipes, inductively heating the metal pipes, and transferring heat to the material through the metal pipes. This method is used as a method of producing steam of a high temperature of about 700° C. (which is sometimes called superheated steam). This apparatus is a large-sized apparatus with few square meters which is difficult to handle. Besides, it is expensive, costing several tens of millions of yen to several hundreds of millions of yen.

Another conventional method is to externally heat, by flame, a metal pipe into which a material to be heated is inserted. This method is a simple method, and hence has a long history of being used. However, the method has poor efficiency and requires a large-sized apparatus. In addition, the method has a drawback of inability to precisely control the temperature of a gas.

There has already been an invention (see, for example, patent literatures 4 and 5) relating to a compact apparatus which instantly produces a high-temperature gas by using a method different from these conventional methods. This invention relates to a heat exchange apparatus using the principle of instantly producing a high-temperature gas by letting a gas pass through a thin trench to produce a high-speed gas and making the gas collide with a metal wall heated to a high temperature. Using this apparatus as a component makes it possible to produce a gas containing a material element (solid gasification) by making a material solid and a high-temperature gas contact each other without increasing the apparatus size.

PRIOR ART LITERATURE

Patent Literature

Patent Literature 1 Japanese Patent Laid-Open No. 2009-173463
Patent Literature 2 Japanese Patent Laid-Open No. 2008-60536
Patent Literature 3 Japanese Patent Laid-Open No. 2014-053477
Patent Literature 4 Japanese Patent Laid-Open No. 2013-235945
Patent Literature 5 Japanese Patent Laid-Open No. 2014-059080

Non-Patent Literature

Non-patent Literature 1 "Free standing GaN wafers produced by void-assisted separation", Hitachi Densen, No. 26 (2007-1), p. 31

SUMMARY OF THE INVENTION

The present invention relates to the simplification of a solid gasification apparatus which extracts a gas by making a high-temperature gas contact a solid and an apparatus using the solid gasification apparatus. This invention is featured to heat a solid with a gas and hence be capable of heating the overall solid, even if it is a heat insulation solid in the form of grain or chip, due to the penetration of the gas. One or more embodiments of the present invention are therefore suitable to heat a raw material which is not easily heated by heat transfer from a container wall.

It is preferable to efficiently generate a gas containing the material element (which will be referred to as a solid gasification gas in this case), produced by making a material solid react with a heated gas, by using a compact apparatus and use the gas. If the storage of the gas to be used poses a danger or there is a risk that the gas will leak, it is not preferable to store the gas. To store the gas, a robust metal vessel is often used. This vessel inevitably becomes heavy and large. Obviously, methods and facilities for the use of such gases are strictly regulated by safety control laws. For this reason, it is preferable to produce such a gas from a safe solid, which can store the gas, only when using. That is, there is a need to produce the amount of gas to be used from a solid (this operation will be referred to as solid gasification).

The method of gasifying a material solid by gasifying it at a high temperature or making a reactive gas contact the solid in a reaction chamber (the method disclosed in patent literature 3) is a solution candidate to a basic issue of the present invention. In order to actually use a gas obtained by solid gasification, it is necessary to switch between starting a reaction and stopping the reaction. Patent literature 3 uses a method of opening/closing the flow path of a solid gasification gas in a high-temperature atmosphere by using a mechanical structure. For this reason, the structure of an apparatus to be used is complicated by the method of heating a material solid itself and the method of mechanically opening/closing the flow path at a high temperature. In addition, according to the method of heating a material itself, the amount of solid gasification gas decreases with a reduction in material solid. For this reason, a challenge of the present invention is to implement a heating method of obtaining the amount of solid gasification gas independently of the remaining amount of material solid.

The second challenge is to produce a solid gasification gas with an inexpensive compact structure. A solution to this challenge is also important from a practical viewpoint. A solid gasification gas is a gas obtained as a result of a reaction, and hence is not necessarily a single-component gas. In addition, it is assumed that components with low vapor pressures adhere to cold piping or the inner wall of the reaction chamber to clog the piping and stop the apparatus. In addition, if the components are gasified again, the composition of a solid gasification gas component as an output changes over time.

The third challenge is associated with this clogging and clogging components. When the apparatus stops or pauses for maintenance, the depreciation cost of the apparatus becomes an accounting loss. This poses a serious issue in practical use. In practice, in an apparatus designed to extract hydrogen as a solid gasification gas from wood chips as a material solid by using superheated steam with a heated gas of an insufficiently high temperature, produced components with low vapor pressures are accumulated in the form of tar, resulting in clogging the piping. This poses a hindrance to the practical use of biomass energy.

One or more embodiments of the present invention as the first embodiments are featured in the structure of an apparatus. This apparatus is a solid gasification apparatus producing a gas containing an element of a material solid by spraying a first heated gas produced by a heat beam fluid heat exchange apparatus against the material solid in a reaction chamber thermally insulated by a heat insulating material to heat the material solid, simultaneously making the material solid react with the first heated gas to produce a produced gas containing the element of the material solid, and making a second heated gas contact and react with the produced gas.

One or more embodiments of the present invention as the second embodiments relate to the solid gasification apparatus according to the first embodiments, in which the material solid comprises a metal including gallium, indium, zinc, titanium, tantalum, or zirconium, a plant-derived organic material including wood chips or paper or the like, or an animal-derived organic material including flesh or oil or fat.

One or more embodiments of the present invention as the third embodiments relate to the solid gasification apparatus according to the first and second embodiments, in which the heated gas comprises steam, a gas including hydrogen, hydrogen halide, air, or carbon hydride, a gas containing hydrogen, hydrogen halide, air, and carbon hydride, or a gas mixture thereof.

One or more embodiments of the present invention as the forth embodiments relate to the solid gasification apparatus according to anyone of the first to third embodiments, in which the heat exchanger and the reaction chamber each comprise ceramics including silicon carbide, a sintered carbon material, a sintered silicon carbon material, or alumina.

One or more embodiments of the present invention as the fifth embodiments relate to the solid gasification apparatus according to any one of first to forth embodiments, in which the heated gas comprises a high-temperature gas having a temperature up to 1,100° C.

According to the first embodiments of the present invention, it is possible to gasify a material solid independently of the remaining amount of the material solid. It is possible to implement solid gasification with a stable amount of gas by placing a material in a thermally insulated continuous vessel and continuously supplying the material. This is important for continuous commercial operation. Since a material solid is heated by a heated gas, the apparatus structure to be used can be simplified as compared with that configured to directly heating the material. A high-temperature heated gas heats the interior wall of the reaction chamber, and hence can prevent the adhesion of a produced gas. Since the material solid is placed in the thermally insulated reaction chamber, the dissipation of energy due to heat dissipation is small. In addition, since a heated gas directly contacts a material solid, the reaction due to the contact between the material solid and the wall of the reaction chamber is suppressed. Since the second heated gas is used to cause a re-reaction of the produced gas produced by the first heated gas, it is possible to control the components of a final solid gasification gas in accordance with a set temperature. In particular, the clogging of the piping is eliminated by preventing solid components from adhering to the cold piping. This is a method that enables the continuous operation of the apparatus, and maximizes the economical merit.

According to the second embodiments of the present invention, the industrial field to which the invention can be applied expands in accordance with the type of material solid. If a gallium metal is a material solid, a gas containing gallium, e.g., gallium chloride, can be produced. When this gas is transported at a high temperature and made to react with heated ammonia on a substrate, a GaN crystal film can be formed. If a material solid is silicon, silicon chloride can be produced by selecting hydrochloric acid as a heated gas. When this gas is transported at a high temperature and made to react with heated hydrogen on a substrate, a silicon crystal film can be formed. If the material solid is titanium, titanium chloride can be produced by selecting hydrochloride acid as a heated gas. When this gas is transported at a high temperature and made to react with heated nitrogen on a substrate, a titanium nitride film can be formed.

According to the third embodiments of the present invention, the industrial field to which the invention can be applied expands in accordance with the type of heated gas described above. Assume that a heated gas is steam, and its temperature is equal to or more than 800° C. In this case, if, for example, organic wood chips are a material solid, it is possible to produce a gas containing hydrogen, carbon dioxide, and methane as main components. When a heated gas is steam and its temperature is 700° C. or less, using, for example, wood chips as a material solid makes it possible to produce a gas containing hydrogen, carbon dioxide, carbon monoxide, and methane as main components. Assume that a heated gas is a gas mixture of steam and air, and the temperature of the gas exceeds 700° C. In this case, if an oil or fat is used as a material solid, the solid is burn to generate heat by itself. At the same time, hydrogen, carbon dioxide, and methane can be produced.

According to the forth embodiments of the present invention, if the heat exchanger of the heat exchange apparatus and the reaction chamber are made of silicon carbide, the temperature of a heated gas can be increased up to 1,000° C. When a heated gas is steam, using, for example, wood chips as a material solid can produce a produced gas containing hydrogen and carbon dioxide as main components. When using a metal, since hydrogen corrodes the metal texture under this temperature, the service life is short. Using ceramics allows high-temperature holding.

According to the fifth embodiments of the present invention, the heated gas can be a high-temperature gas of a temperature up to at least 1,100° C. Assume that the heat exchanger of the heat exchange apparatus and the reaction chamber are made of alumina, for example. In this case, if an introduced gas is a gas mixture of carbon hydride and steam, hydrogen and carbon dioxide are produced in the heat exchange apparatus of 1,000° C. That is, it is possible to produce hydrogen in the heat exchange apparatus without separately preparing hydrogen and to make the hydrogen contact a material solid.

DETAILED DESCRIPTION OF THE PREFERRED EMBODIMENTS

One or more embodiments of the present invention will be described in detail below with reference to the accompanying drawings.

Note that the constituent elements of this embodiment can be replaced with existing constituent elements and the like, and can be variously combined with other existing constituent elements. Therefore, the description of the embodiment does not limit the contents of the invention described in the embodiments.

Embodiment

Figure 1:
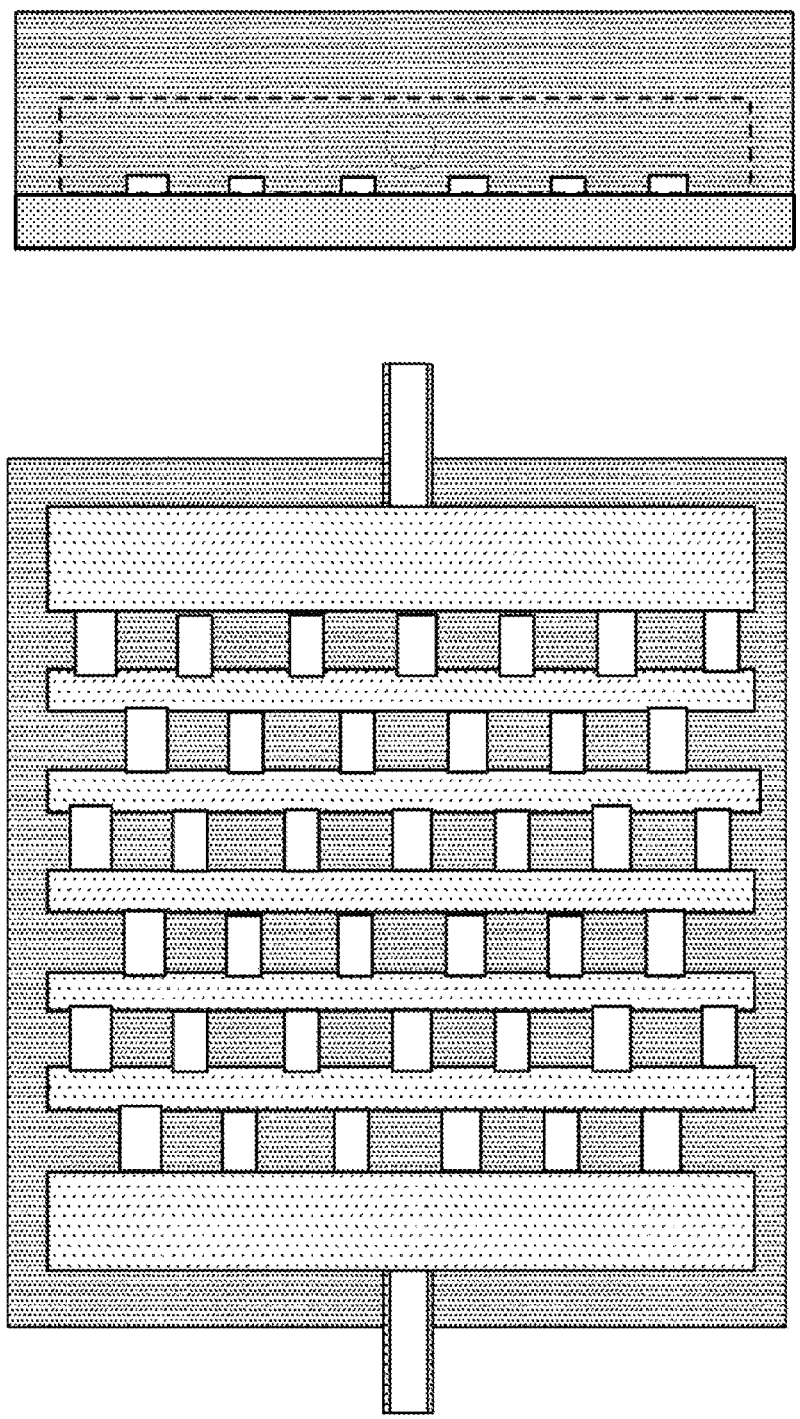
FIG. 1 is a structural principle view of the heat exchanger of a heat beam fluid heat exchange apparatus.

FIG. 1 is a structural principle view concerning the heat exchanger structure of a heat beam fluid heat exchange apparatus. The heat exchange apparatus based on FIG. 1 will be referred to as a heat beam fluid heat exchange apparatus hereinafter. The heat beam fluid heat exchange apparatus is produced and distributed by Philtech Inc. (University of Tokyo Entrepreneur Plaza, 7-3-1 Hongo, Bunkyo-ku, Tokyo) (Internet: <URL: http://www.philtech.co.jp/products_servies/index.html>).

For example, this fluid heat exchange apparatus including a 2.5 kW Sic electric heater has an ability to heat room-temperature nitrogen gas up to 1,100° C. and emit it at a flow rate of 70 SLM. This heat beam fluid heat exchange apparatus is compact, having a length of 326 mm.

Figure 2:
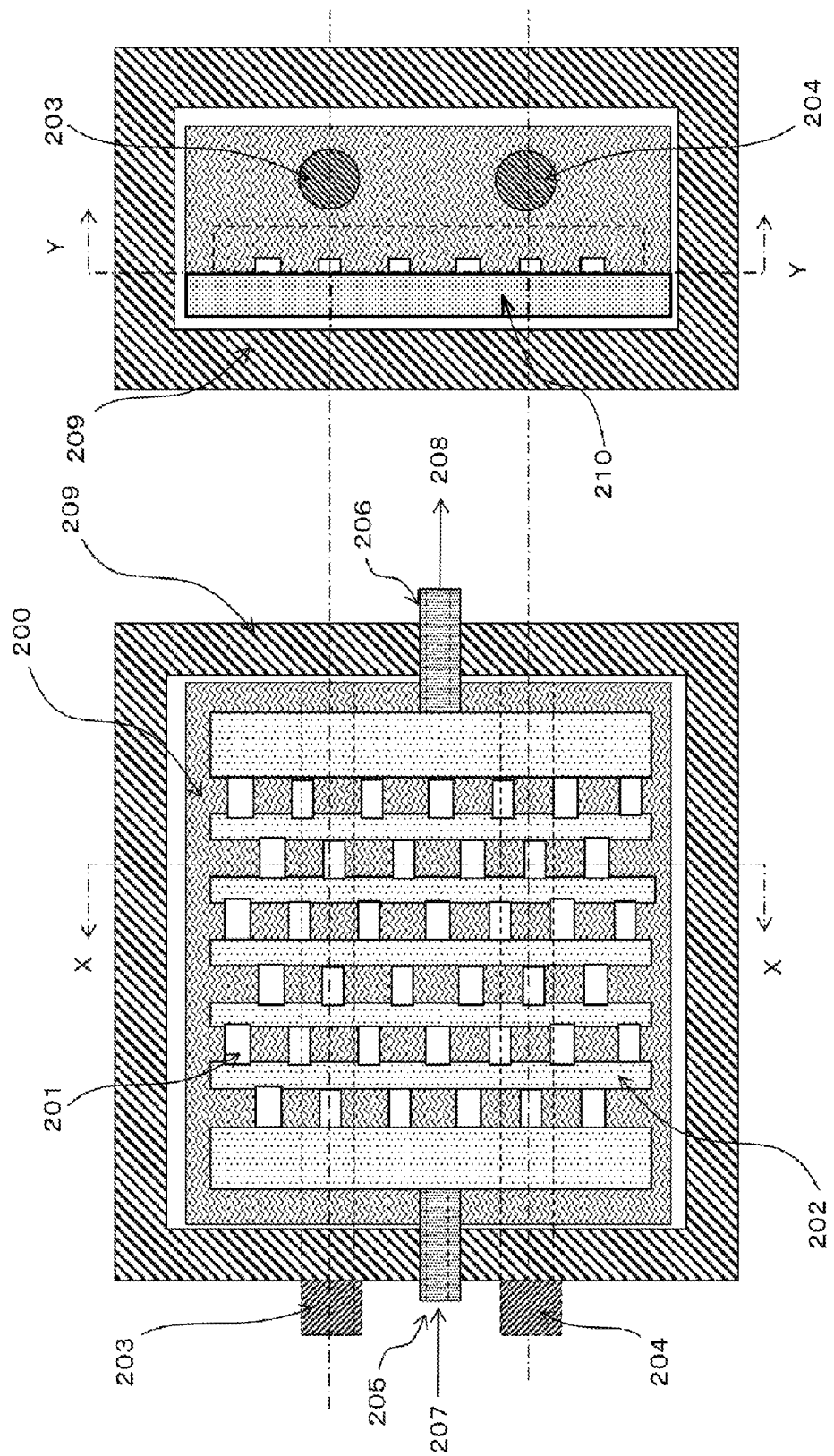
FIG. 2 is a schematic view of the structure of the heat beam fluid heat exchange apparatus.

FIG. 2 is a schematic view of the structure of the heat beam fluid heat exchange apparatus having a heater provided for the fluid heat exchanger in FIG. 1. The principle of the heat beam fluid heat exchange apparatus will be described below.

A heat exchanger 200 of the heat beam fluid heat exchange apparatus includes vertical trenches 201 and horizontal trenches 202 in gas flow paths. Each narrow vertical trench 201 increases the flow velocity of a gas. The gas with a high flow velocity collides with the wall of each horizontal trench 202 to perform heat exchange. This principle is the principle of high-efficiency heat exchange, and hence a heat exchange apparatus having a large number of such heat exchange structures is an apparatus which can heat or cool a gas with high efficiency.

The heat charged into the heat beam fluid heat exchanger 200 by heaters 203 and 204 is efficiently transferred to an introduced gas 207 introduced from a gas inlet 205. A heated gas 208 is then emitted from a heated gas outlet 206.

According to the inventions disclosed in patent literatures 4 and 5, the heat beam fluid heat exchanger 200 described above may be made of a metal, ceramics, or a compound material, which can be selected, as needed, in accordance with the type and temperature of gas to be made to contact the exchanger. The heat beam fluid heat exchanger 200 may have either a planar shape or a cylindrical shape. In addition, each flow path of the heat beam fluid heat exchanger 200 may have either a trench shape or a hole shape. The number of flow paths can be freely designed.

Figure 3:
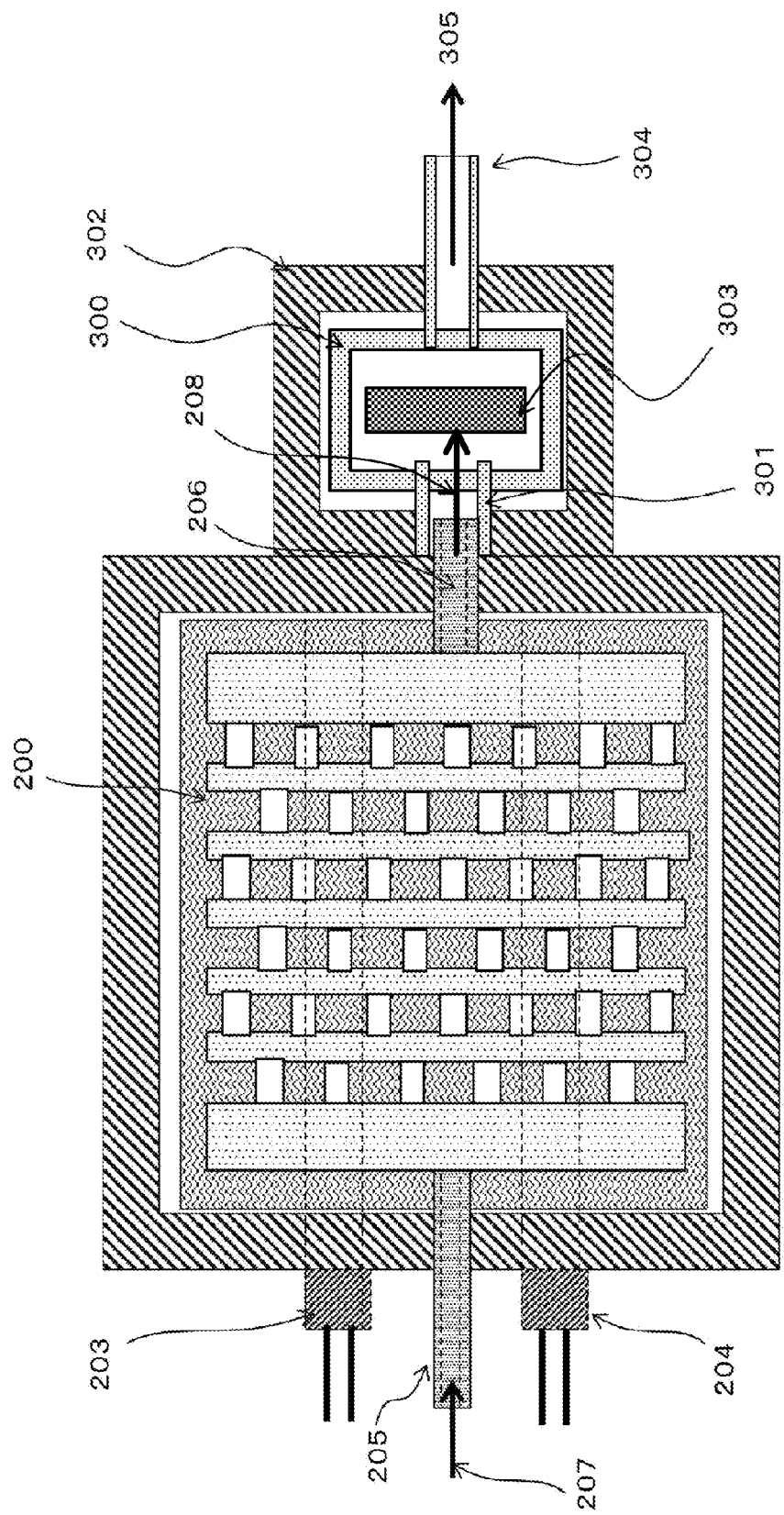
FIG. 3 is a schematic view of the basic structure of a solid gasification apparatus.

FIG. 3 is a view schematically showing the basic function of the solid gasification apparatus.

The basic structure includes a reaction chamber 300 which is coupled to the heat beam fluid heat exchanger 200 in FIG. 2 and stores a material solid. In addition, the heated gas outlet 206 is coupled to a heated gas inlet 301. The reaction chamber 300 is thermally insulated by a heat insulating material 302 to suppress heat dissipation. The heated gas 208 from the heat beam fluid heat exchanger 200 directly contacts a material solid 303, and a produced gas 305 containing the element of the material solid 303 emerges from a produced gas outlet 304. If the amount of the material solid 303 is sufficient, since the amount of the produced gas 305 depends on the temperature and flow rate of the heated gas 208, the degree of dependence of the amount of the produced gas 305 on the remaining amount of the material solid 303 is low.

The type of the produced gas 305 depends on the type of material solid and the type of the high-temperature heated gas 208 that can be produced. When using a metal as the material solid 303, it is possible to produce the produced gas 305 containing the metal element. If, for example, gallium (Ga) is used, gallium chloride can be produced. Using silicon (Si) can produce silicon chloride. In addition, selecting a proper heated gas can produce the produced gas 305 containing a metal element such as indium, aluminum, zinc, titanium, tantalum, or zirconium.

Using a halogen such as chlorine or halogen halide such as hydrochloric acid as the heated gas 208 can produce a halide metal. Using hydrogen as the heated gas 208 can produce a hydride metal. If the material solid 303 is a plant-derived organic material such as wood chips or paper or an animal-derived organic material such as flesh or oil or fat, it is possible produce the produced gas 305 such as hydrogen, methane, or carbon dioxide, or the like.

The heated gas 208 in this case is superheated steam of 600° C. or more. Note that the temperature of the heated gas 208 can be arbitrarily set. Changing the set temperature of the superheated steam to 1,100° C. makes it possible to produce an organic-derived produced gas having a sufficient vapor pressure depending on the temperature. When an inert gas such as nitrogen is used as the heated gas 208, a metal may be used as a constituent material for the heat beam fluid heat exchanger 200 and the reaction chamber 300. If, however, a halogen, hydrogen halide, hydrogen, water, air, or carbon hydride is selected as the heated gas 208, a constituent material for the heat beam fluid heat exchanger 200 and the reaction chamber 300, which contact the gas, needs to be selected properly depending on a set temperature for heating.

Candidates for the constituent material include ceramic and quartz glass. It is preferable to select an actual material in consideration of workability and thermal strain fracture resistance. Ceramics as effective materials include the material obtained by sintering silicon carbide or carbon, the material obtained by sintering silicon and carbon powders, and alumina. Depending on the temperature, plastic compound materials such as graphene, carbon nanotube, SiC fiber, and the like can be material candidates.

The produced gas 305 is not necessarily a single component gas. When the produced gas 305 contains a plurality of components, components with low vapor pressures adhere in a solid form to the low-temperature downstream portion of the piping or the wall of the reaction chamber 300. There is also a phenomenon in which the adhering solidified substances evaporate again. This phenomenon is associated with the reproducibility of the components and amounts when using the produced gas 305, and hence is important for the commercial operation of the apparatus.

In order to address this issue, the reaction needs to be accelerated to produce the produced gas 305 containing no components with low vapor pressures. Alternatively, it is necessary to move the gas without solidification to a place on the downstream side where no re-evaporation occurs.

For this reason, the present embodiment is configured to sufficiently accelerate the reaction by making the second heated gas contact the produced gas 305. This reaction can produce the produced gas 305 containing stable components with high vapor pressures. The gas reacted by making the second heated gas contact it will be called the solid gasification gas to be discriminated from the produced gas 305.

The second heated gas described above has not only the function of accelerating a reaction but also the function of transporting the produced gas 305 while maintaining it at a high temperature (high-temperature transportation function). This high-temperature transportation function prevents the clogging of the piping when the produced gas 305 is transported to another place through the piping. This function is necessary for the apparatus to perform stable continuous operation.

The present embodiment is featured in the structure configured to make the second heated gas merge with a produced gas. In this case, an apparatus which gasifies the material solid 303 to produce a gas containing the element of the material solid 303 by using this structure will be referred to as a solid gasification apparatus. The gas produced by this apparatus will be referred to as the solid gasification gas.

Example 1

Figure 4:
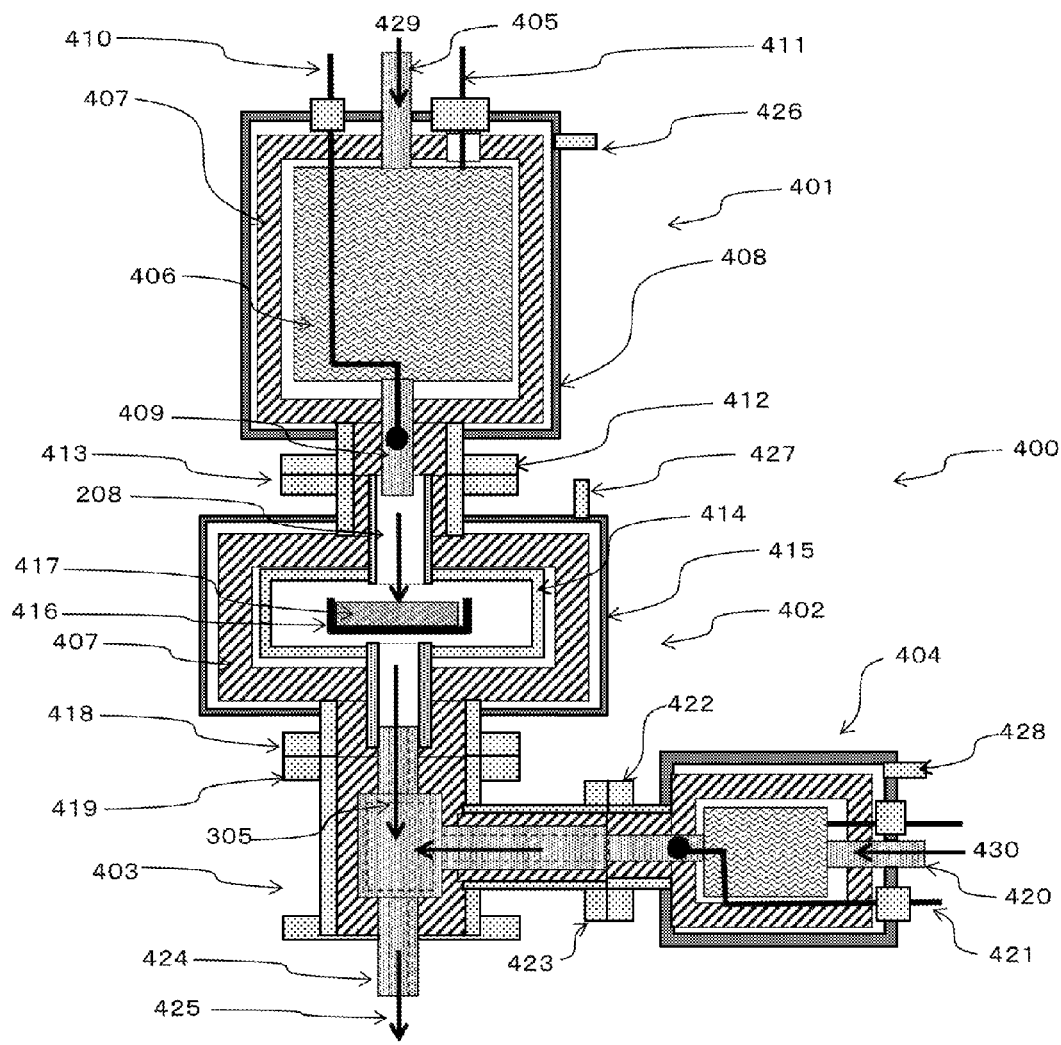
FIG. 4 is a schematic view of the structure of a solid gasification apparatus according to an Example.

FIG. 4 is a schematic view of the structure of a solid gasification apparatus 400 according to Example 1.

The solid gasification apparatus 400 is constituted by a first heated gas production apparatus 1 (401), a solid gasification chamber 402, a high-temperature gas contact chamber 403, and a second heated gas 430 production apparatus 2 (404).

A first gas 429 to be heated is introduced from an inlet 405 for the first heated gas. A heat beam fluid heat exchanger 406 having the basic structure shown in FIG. 3 heats the first gas 429. The heat beam fluid heat exchanger 406 is made of sintered silicon carbon ceramics. Two 2.5-kW silicon carbide heaters (not shown) are inserted into the heat beam fluid heat exchanger 406, and hence can generate heat of 1,200° C.

The heat beam fluid heat exchanger 406 is thermally insulated by a heat insulating material 407 and is housed in a sealed case 408 of the first heated gas production apparatus 1 (401). The first heated gas 429 exits from an outlet 409 for the first heated gas. The temperature of the outlet 409 for the first heated gas 429 is measured by a first heated gas thermocouple 410.

The first heated gas thermocouple 410 and a heater feeder wire 411 of the first heated gas production apparatus 1 (401) extend outside the sealed case 408 of the first heated gas production apparatus 1 (401) through connectors, thereby implementing a sealed structure. The first heated gas production apparatus 1 (401) is connected to an inlet connection flange 413 of the reaction chamber of the solid gasification chamber 402 through an outlet flange 412. A reaction chamber 414 is enclosed by a sealed case 415 of the reaction chamber 414 through the heat insulating material 407. The reaction chamber 414 includes a transfer vessel 416 of a movable material solid 417, and can be moved by a moving mechanism (not shown). This movement makes it possible to continuously supply the material solid 417.

The first heated gas 429 from the outlet 409 for the first heated gas 429 vertically collides with the material solid 417 to heat its surface. This heating makes the heated gas react with the material solid 417. As a result, the produced gas 305 containing the element of the material solid 417 is produced. The produced gas 305 is transported by the first heated gas 429 and moved to the high-temperature gas contact chamber 403.

An outlet connection flange 418 of the reaction chamber 414 is connected to an inlet connection flange 419 of the high-temperature gas contact chamber 403. The produced gas 305 then moves to the high-temperature gas contact chamber 403. The above produced gas 305 in a high-temperature state contacts the second heated gas 430. The second heated gas production apparatus 2 (404) produces the second heated gas 430. A second heated gas thermocouple 421 measures the temperature of the gas.

An outlet flange 422 of the second heated gas production apparatus 2 (404) is connected to an introduction flange 423 for the second heated gas. The second heated gas as a high-temperature gas contacts the produced gas 305 in the high-temperature gas contact chamber 403 to produce a solid gasification gas 425 from an outlet 424 of the high-temperature gas contact chamber.

If a heated gas has metal corrosiveness, nitrogen as an inert gas is introduced from purge gas inlets 426, 427, and 428 to prevent the corrosion of the constituent metal of the first heated gas production apparatus 1 (401), the solid gasification chamber 402, and the second heated gas production apparatus 2 (404).

The above description has exemplified the case in which the solid gasification apparatus 400 produces the solid gasification gas 425 as an output gas. It is possible to select the first gas 429 and the second gas 430 to be introduced, as needed, in accordance with the purpose. In addition, the two gases may be of the same kind. The solid gasification apparatus 400 has been described as an Example of the apparatus structure.

Example 2

Example 1 has exemplified the structure of the solid gasification apparatus 400. It is possible to obtain a produced gas 305 containing $SiCl_4$ or $SiHCl_3$ as a silane chloride by placing a silicon wafer as a material solid 417 and using hydrochloride acid (HCl) as a first gas 429.

A heat beam fluid heat exchanger 406 is made of sintered silicon carbon ceramics. This sintered material does not react with hydrochloride acid. Since hydrochloride acid reacts with a metal, nitrogen was introduced from purge gas inlets 426, 427, and 428. The temperature indicated by a first heated gas thermocouple 410 was controlled at 900° C. A second gas 430 was nitrogen, and the temperature indicated by a second heated gas thermocouple 421 was controlled at 900° C.

A solid gasification gas 425 is a high-temperature gas of silane chloride and nitrogen. A silicon crystal film can be formed by transporting this gas while keeping its high temperature, guiding the gas to a heated substrate (not shown), and spraying it together with hydrogen. In order to stop producing silane chloride, hydrochloride acid as the first gas is switched to an inert gas such as nitrogen or argon, and the heating temperature is lowered.

According to the above case, silane chloride is produced from a silicon wafer as the material solid 417. However, using gallium metal (Ga) as the material solid 417 makes it possible to produce gallium chloride as the solid gasification gas 425 by temperature adjustment.

Example 3

If a material solid 417 is a plant-derived organic material and the first and second gases are steams, a solid gasification gas 425 containing hydrogen and carbon dioxide as main components is obtained. This organic material is, for example, wood chips. A first heated gas production apparatus 1 (401) and a second heated gas production apparatus 2 (404) produce superheated steams 1 and 2 regardless whether the steams as the first and second gases are water or heated steams.

The temperature setting for superheated steams 1 and 2 is 1,000° C. Superheated steam reacts with wood chips to produce a gas containing steam, hydrogen, carbon monoxide, carbon dioxide, and methane as main components. It is possible to generate electricity by driving a turbine or internal combustion engine by burning the produced gas with air.

According to this apparatus, the produced gas contacts superheated steam as the second heated gas in the high-temperature gas contact chamber 403 to cause a re-reaction. This contact further accelerates the reaction to output, from the solid gasification apparatus 400, the solid gasification gas 425 with an increased ratio of hydrogen and carbon dioxide as main components. The solid gasification apparatus 400 can be operated as an apparatus which produces hydrogen from wood chips. If hydrogen is produced, power and thermal energy can be extracted by operating a fuel cell. It is therefore possible to operate the solid gasification apparatus 400 as an apparatus which extracts renewable energy from a plant-derived organic material. This reaction also occurs in an animal-derived organic material. In addition, likewise, the reaction also occurs in organic materials such as coal, heavy oil, and oil or fat.

DESCRIPTION OF REFERENCE NUMERALS

200 . . . heat beam fluid heat exchanger
201 . . . vertical trench
202 . . . horizontal trench
203 . . . heater
204 . . . heater
205 . . . gas inlet
206 . . . heated gas outlet
207 . . . introduced gas
208 . . . heated gas
209 . . . heat insulating material
210 . . . sealing plate
300 . . . reaction chamber
301 . . . heated gas inlet
302 . . . heat insulating material
303 . . . material solid
304 . . . produced gas outlet
305 . . . produced gas
400 . . . solid gasification apparatus
401 . . . first heated gas production apparatus 1
402 . . . solid gasification chamber
403 . . . high-temperature gas contact chamber
404 . . . second heated gas production apparatus 2
405 . . . first gas inlet
406 . . . heat beam fluid heat exchanger
407 . . . heat insulating material 408 . . . sealed case of production apparatus 1
409 . . . first heated gas outlet
410 . . . first heated gas thermocouple
411 . . . heater feeder wire of production apparatus 1
412 . . . outlet connection flange of production apparatus 1
413 . . . inlet connection flange of reaction chamber
414 . . . reaction chamber
415 . . . sealed case of reaction chamber
416 . . . transfer vessel of material solid
417 . . . material solid
418 . . . outlet connection flange of reaction chamber
419 . . . inlet connection flange of high-temperature gas contact chamber
420 . . . second heated gas inlet
421 . . . second heated gas thermocouple
422 . . . outlet connection flange of second heated gas production apparatus 2
423 . . . introduction flange for second heated gas
424 . . . outlet of high-temperature gas contact chamber
425 . . . solid gasification gas
426 . . . purge gas inlet
427 . . . purge gas inlet
428 . . . purge gas inlet
429 . . . first gas
430 . . . second gas

The invention claimed is:

1. A solid gasification apparatus, comprising:
a reaction chamber thermally insulated by a heat insulating material;
a heat beam fluid heat exchange apparatus that produces a first heated gas and a second heated gas; and
a unit that includes a gas flow path,
wherein the unit sprays the first heated gas against a material solid in a reaction chamber to heat the material solid, and, simultaneously, makes the material solid react with the first heated gas to produce a produced gas containing the element of the material solid; and
wherein the unit makes a second heated gas contact and react with the produced gas.

2. The solid gasification apparatus according to claim 1, wherein the material solid comprises a metal including gallium, indium, zinc, titanium, tantalum, or zirconium, a plant-derived organic material including wood chips or paper or the like, or an animal-derived organic material including flesh or oil or fat.

3. The solid gasification apparatus according to claim 1, wherein the first heated gas and the second heated gas each comprise steam, a gas including hydrogen, hydrogen halide, air, or carbon hydride, a gas containing hydrogen, hydrogen halide, air, and carbon hydride, or a gas mixture thereof.

4. The solid gasification apparatus according to claim 1, wherein the heat beam fluid heat exchange apparatus and the reaction chamber each comprise ceramics including silicon carbide, a sintered carbon material, a sintered silicon carbon material, or alumina.

5. The solid gasification apparatus according to claim 1, wherein the first heated gas and the second heated gas each comprise a high-temperature gas having a temperature up to 1,100° C.

* * * * *